United States Patent
Byle et al.

(10) Patent No.: US 6,320,139 B1
(45) Date of Patent: Nov. 20, 2001

(54) REFLOW SELECTIVE SHORTING

(75) Inventors: Francis R. Byle, Hubertus; Kevin M. McCoy, Muskego; Todd J. Zorn, New Berlin, all of WI (US)

(73) Assignee: Rockwell Automation Technologies, Inc., Mayfield Heights, OH (US)

(*) Notice: Subject to any disclaimer, the term of this patent is extended or adjusted under 35 U.S.C. 154(b) by 0 days.

(21) Appl. No.: 09/190,688

(22) Filed: Nov. 12, 1998

(51) Int. Cl.[7] .................................................. H01R 9/09
(52) U.S. Cl. ........................ 174/261; 361/777; 361/779
(58) Field of Search ................................... 174/261, 250, 174/260; 361/773, 777, 778, 779, 767, 768

(56) References Cited

U.S. PATENT DOCUMENTS

| | | | |
|---|---|---|---|
| 2,615,768 | 10/1952 | Schluchter | 384/284 |
| 3,020,510 | 2/1962 | Kuch | 439/59 |
| 3,365,539 | 1/1968 | Bratsch | 174/88 R |
| 3,528,048 * | 9/1970 | Kirk | 337/401 |
| 3,614,706 | 10/1971 | Kukla | 439/109 |
| 3,660,726 | 5/1972 | Ammon et al. | 174/262 |
| 3,671,917 | 6/1972 | Ammon et al. | 439/62 |
| 3,685,001 | 8/1972 | Krafthefer | 439/81 |
| 3,693,135 | 9/1972 | Vavrick et al. | 439/328 |
| 3,783,433 | 1/1974 | Kurtz et al. | 439/82 |
| 3,808,578 | 4/1974 | Hansen | 439/595 |
| 3,905,665 | 9/1975 | Lynch et al. | 439/62 |
| 3,973,893 | 8/1976 | Camp, III | 425/324 |
| 3,992,135 | 11/1976 | Camp, III | 425/174 |
| 4,025,272 | 5/1977 | Camp, III | 425/324 |
| 4,195,195 | 3/1980 | de Miranda et al. | 174/254 |
| 4,485,166 | 11/1984 | Herwig et al. | 430/260 |
| 4,611,746 | 9/1986 | Levine et al. | 228/123.1 |
| 4,743,489 | 5/1988 | Hasegawa | 428/210 |
| 4,752,027 | 6/1988 | Gschwend | 228/180.22 |
| 4,761,325 | 8/1988 | Kurihara et al. | 428/209 |
| 4,861,646 | 8/1989 | Barringer et al. | 428/210 |
| 4,867,715 | 9/1989 | Roth et al. | 439/876 |
| 4,879,156 | 11/1989 | Herron et al. | 428/137 |
| 4,939,452 | 7/1990 | Reinholz | 324/754 |
| 4,968,589 | 11/1990 | Perry | 430/314 |
| 5,004,640 | 4/1991 | Nakatani et al. | 428/195 |
| 5,167,361 | 12/1992 | Liebman et al. | 228/180.22 |
| 5,172,853 | 12/1992 | Maiwald | 228/248.1 |
| 5,226,964 | 7/1993 | Meuche | 118/424 |
| 5,288,950 | 2/1994 | Ushio et al. | 174/254 |
| 5,308,928 * | 5/1994 | Parla et al. | 174/261 |
| 5,429,100 | 7/1995 | Goto et al. | 123/559.1 |
| 5,438,749 | 8/1995 | Runyon | 29/825 |
| 5,479,319 | 12/1995 | Werther | 361/784 |
| 5,480,483 | 1/1996 | Velie | 118/45 |
| 5,481,435 | 1/1996 | Werther | 361/784 |
| 5,481,436 | 1/1996 | Werther | 361/784 |
| 5,484,962 * | 1/1996 | Gamo | 174/261 |

* cited by examiner

Primary Examiner—Kamand Cuneo
(74) Attorney, Agent, or Firm—Joseph N. Ziebert; Alexander M. Gerasimow; William R. Walbrun

(57) ABSTRACT

A bridge structure is utilized on a circuit board. The bridge structure includes a first element, a second element and a gap between the first element and a second element. Soder paste is capable of flowing when the circuit board is heated, such that the paste on the first element comes into contact with paste on the second element. The paste solidifies when cooled such that solidified paste serves to connect the first element and the second element. The first and second elements can be L-shaped.

20 Claims, 4 Drawing Sheets

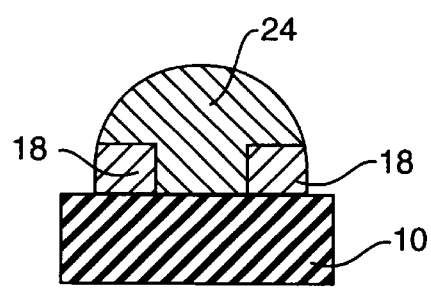
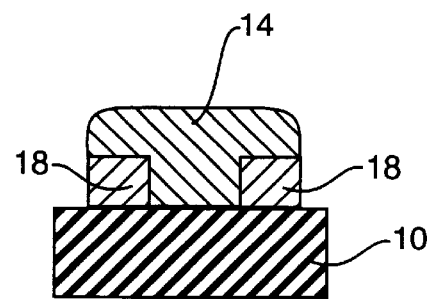
FIGURE 6         FIGURE 4
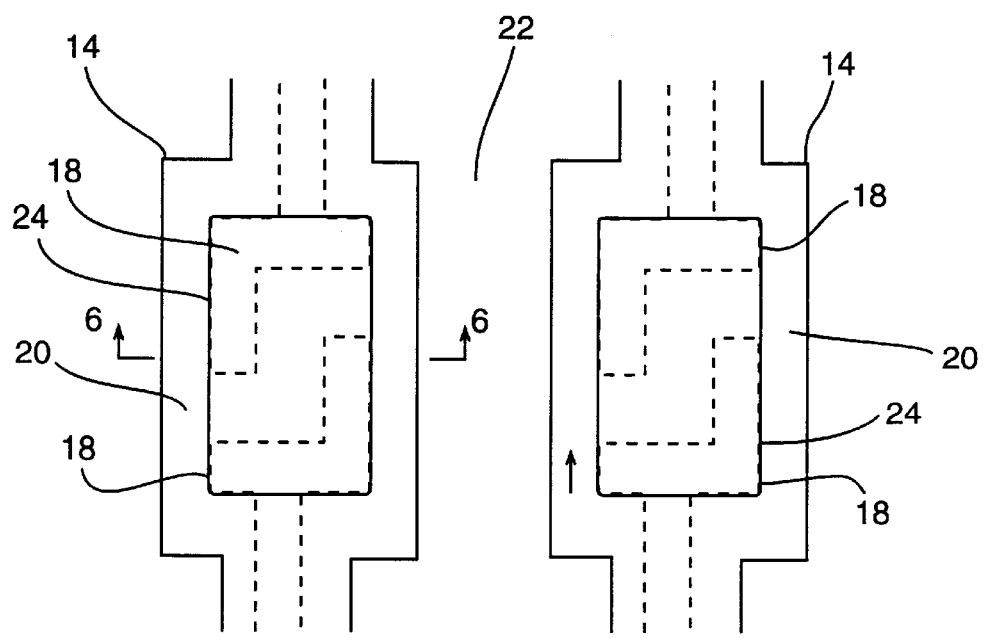
FIGURE 5

REFLOW SELECTIVE SHORTING

FIELD OF THE INVENTION

The present invention relates generally to the field of circuit boards. More particularly, the invention relates to apparatus for selectively coupling circuit board traces.

BACKGROUND OF THE INVENTION

Circuit boards are commonly used in a variety of electronic and electrical systems to perform diverse applications. For example, computers, televisions, manufacturing facilities, industrial equipment, and household appliances all rely upon circuit boards to house electronic components and to communicate electric signals and power. Circuit boards generally include printed wire conductors or circuit board traces for communicating electric power or electric signals to and from devices and connectors on the circuit board. The circuit board traces can be arranged in diverse patterns and can be disposed on any number of layers of the circuit board.

To take advantage of economies of scale, the same circuit board is often produced for a number of different products, models, or applications. The circuit board can be configured for any of a number of uses, modes, or applications after the circuit board is manufactured. The circuit boards are typically configured by connecting or disconnecting circuit board traces via a switch or jumper wire. In this way, a circuit board, which is designed according to an unvarying pattern and produced in large quantities, can be utilized in a multitude of different applications, modes, or uses.

Configuring circuit boards with switches or jumper wires can be disadvantageous. Connecting circuit traces with jumper wires and setting switches increases the assembly cost associated with circuit boards. Additionally, jumpers (e.g., zero-ohm jumpers) and switches can be expensive, especially when inventory costs are considered. Further still, jumper wires and switches require that additional space (e.g., real estate) on the circuit board be utilized for pads or bonding areas associated with those products.

Thus, there is a need for apparatus for selectively connecting circuit board traces. Further still, there is a need for a system for forming an intentional short or bridge between two areas of exposed metal conductors (e.g., traces) on a circuit board. Further still, there is a need for a reflow solder technique that allows circuit board traces to be selectively coupled together without the use of a switch or a jumper wire.

SUMMARY OF THE INVENTION

The present invention relates to a bridge structure on a circuit board. The bridge structure includes a first conductive trace element, a second conductive trace element spaced, near the first conductive trace element, and a gap. The gap lies between the first trace element and the second trace element. A solder paste is placed upon the first element and the second element. The paste is capable of flowing when the circuit board is heated such that the paste on the first element comes into contact with the paste on the second element. The paste solidifies when the circuit board is cooled such that the solidified paste serves to connect the first element and the second element to form an electrical connection between the elements.

The present invention further relates to a circuit board including a first element and a second element separated by a gap. The first element is coupled to the second element by a method. The method includes placing a solder paste on the first element, the gap and on the second element, heating the circuit board such that the paste flows over the gap and connects the first element and the second element, and cooling the circuit board such that the paste solidifies.

The present invention even further relates to a bridge structure on a circuit board. The bridge structure includes a first element, a second element, a gap between the first element and the second element, and a means for connecting the first element and the second element via a reflow solder technique such that electricity is capable of flowing across the bridge structure.

BRIEF DESCRIPTION OF THE DRAWINGS

The present invention will hereafter be described, wherein like numerals denote like elements and;

FIG. 4 is a cross-sectional view about line 4—4 of the bridge circuit illustrated in FIG. 2 after the solder paste is applied;

FIG. 5 is a top view schematic drawing of the pair of bridge circuits illustrated in FIG. 2 after a reflow soldering step;

FIG. 6 is a cross-sectional view of the bridge circuit illustrated in FIG. 5 about line 6—6;

DETAILED DESCRIPTION OF THE INVENTION

Figure 1:
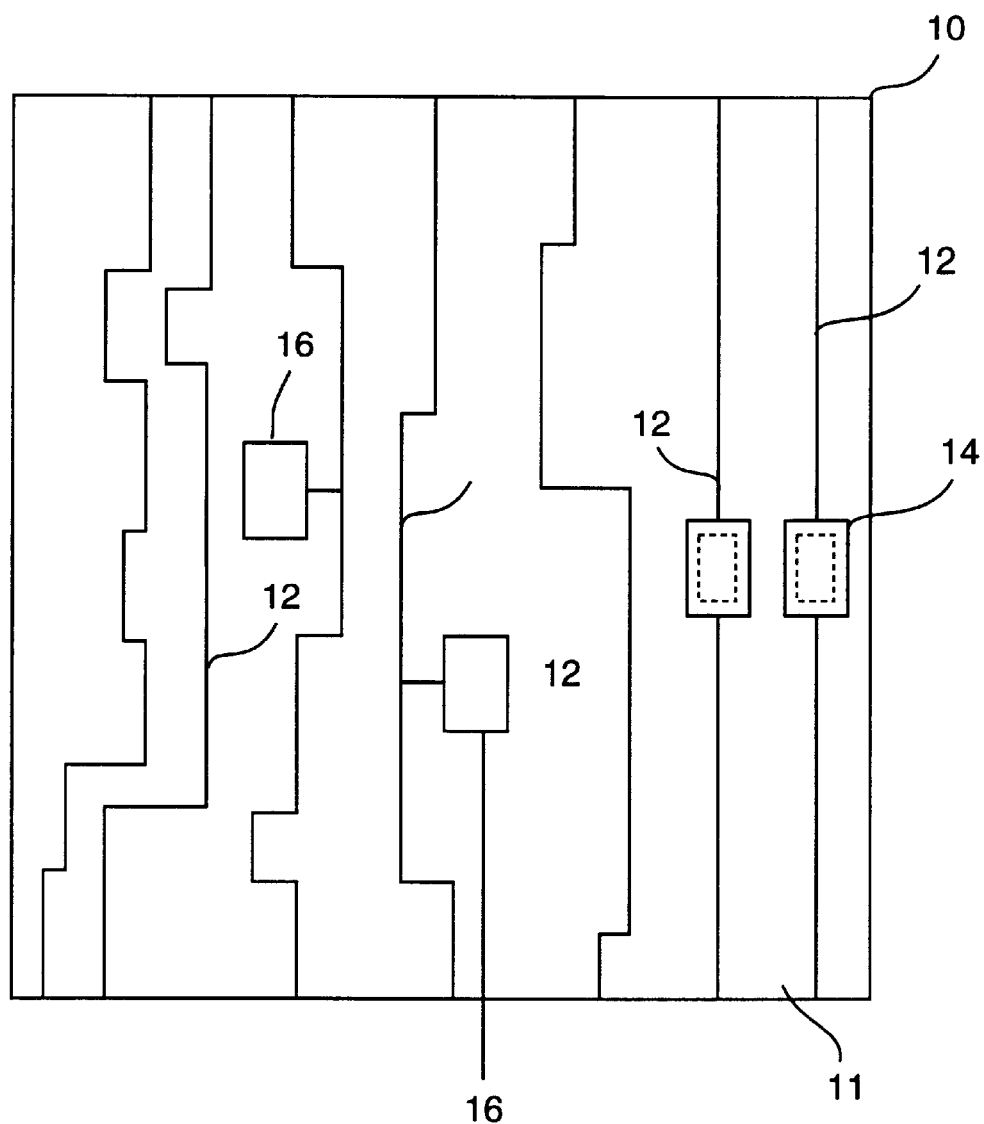
FIG. 1 is a schematic illustration of a top view of a circuit board including a pair of bridge circuits in accordance with an exemplary embodiment of the present invention.
Figure 3:
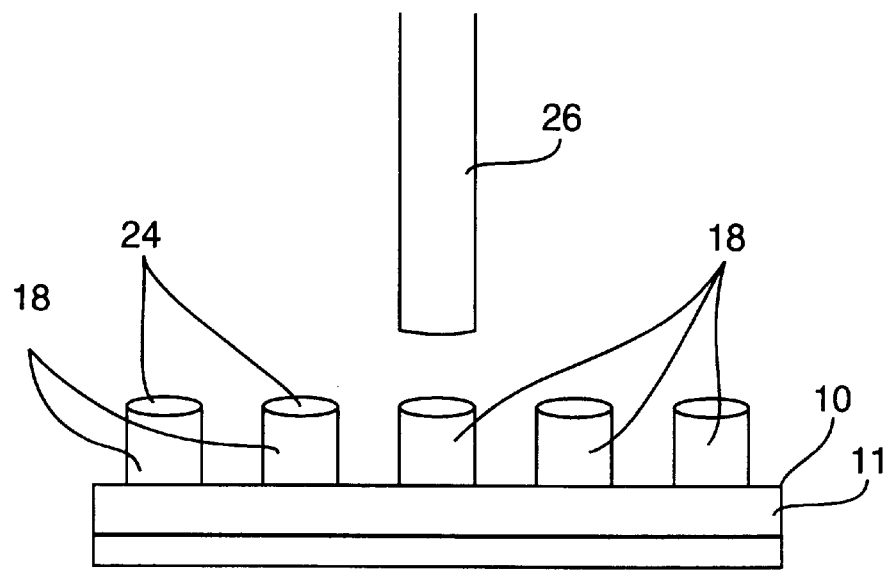
FIG. 3 shows a cross-sectional view of the circuit board illustrated in FIG. 1, wherein solder paste is applied to the circuit board.

With reference to FIG. 1, an electrical circuit board 10 includes bridge circuits 14 coupled to conductive traces 12. Board 10 is produced wherein a conductive metal is placed upon an insulating material 11 (FIG. 3). A layer of photoresist is placed upon the conductive metal, and a pattern of light is directed toward circuit board 10. The metal layer is etched according to known photolithographic techniques to form a pattern on the conductive metal layer including traces 12 and circuits 14. Traces 12 provide interconnections between devices 16 and circuits 14. Devices 16 are generally attached to board 10 via a soldering technique, such as, a wave soldering, eutectic technique or reflow technique.

Figure 2:
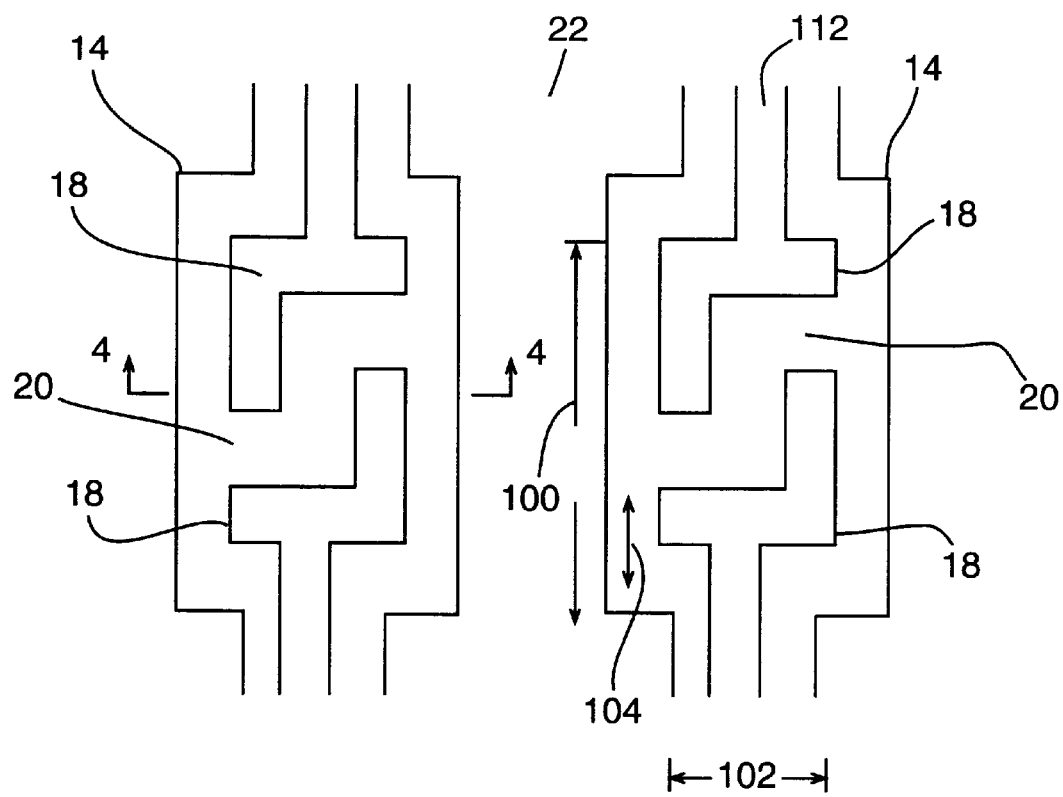
FIG. 2 shows a more detailed top view of the pair of bridge circuits illustrated in FIG. 1.

With reference to FIG. 2, bridge circuits 14 provide an inexpensive technique of forming an intentional short, or bridge, between two traces on a circuit board, thereby allowing electric current to travel across the bridge. Circuits 14 advantageously allow an intentional short between two traces on a circuit board to be formed without the use of jumpers, zero-ohm resistors, or switches.

Bridge circuits 14 include two trace elements 18 arranged in such positions so heated liquefied solder 24 (FIG. 3) is capable of existing across a gap 20 between the two trace elements 18. The trace elements 18 can be placed in a variety of patterns, but it is important that the trace elements 18 are spaced far enough apart such that a solder-dispensing apparatus 26 (FIG. 3) is capable of accurately dispensing the soldering paste 24 in the correct position (e.g., on elements 18 and between elements 18) yet near enough to each other that the solder 24 on one trace element 18 is capable of connecting via the solder 24 on the other trace element 18 when heated. The individual trace elements 18 must also be large enough so as to contain enough solder 24 (e.g, volume of solder) to connect the complementary trace element 18. Additionally, circuits 14 on the circuit board 10 must be spaced far enough away from each other so as to prevent solder 24 from inadvertently flowing from one circuit 14 to another circuit 14 (or to and from other traces 12 on circuit board 10). Preferably, solder paste is provided on elements 18 and over gap 20.

In FIG. 2, each of circuits 14 includes at least two conductive trace elements 18, and individual circuits 14 are separated by spaces 22. In one embodiment of the invention, circuit 14 includes two conductive trace elements 18 formed in complementary inverse "L" shapes. Although the trace elements 18 can have varying widths and can have gaps 20 of varying distances between them, the parameters must be controlled such that the connection will be effectively made on a consistent basis. When the conductive trace elements 18 are formed in an "L" shape, a trace width of 0.008 inches is adequate when the gap 20 is no more than 0.0090 inches in width. Additionally, individual circuits 14 must be spaced far enough apart from each other to ensure that neighboring circuits 14 are not accidentally shorted. For L-shaped trace elements 18 of 0.008 inches in width, a spacing 22 of at least 0.040 inches may be required to ensure against accidental short circuits. In FIG. 2, spacing 22 is center-to-center spacing between pairs of complementary traces 18.

With reference to FIG. 3, dispensing device 26 deposits soldering paste 24 upon trace elements 18 in controlled amounts in accordance with a reflow solder technique. The reflow solder technique generally applies solder via a wiper and a stencil (e.g., silk screening technique). The stencil has apertures which co-incide with areas which should receive solder. For example, pads which eventually receive leads are coated with solder. The leads of a device, such as, device 26, are placed on the pads, and the board is heated to attach the leads to the pads. Alternatively, device 26 can be a dispensing nozzle.

The amount of paste 24 deposited on the board 10 can vary depending upon the size of the apertures in the stencil (e.g., the foil) and the thickness of the foil. Solder paste 24 can comprise any of several eutectics and alloys. Some types of pastes that can be utilized include a 63/37 tin/lead eutectic, a 62/36/2 tin/lead/silver eutectic, or a 96/3.5 tin/silver eutectic. Additionally, indium-containing solders, conductive epoxies, and other substances could also be used as a soldering paste.

Individual devices 26, such as, computer circuit chips, integrated circuits, and other components, are placed on board 10 in the appropriate position after solder paste 24 is applied. After the devices 26 are applied, board 10 is heated so that devices 16 are attached to board, and the selected bridge circuits 14 are shorted. The pattern associated with the stencil is configured so that selected circuits 14 are shorted. For example, one stencil which serves to short all circuits 14 can be used for one application of board 10, and another stencil which serves to short only a few of circuits 14 can be used for another application of board 10. In other embodiments of the invention, the conductive paste 24 is placed on circuit board 10 for circuits 14 in a unique process step before components are placed on the circuit board 10.

Because soldering paste 24 must be capable of flowing such that it electrically connects neighboring trace elements 18 in circuit 14 to each other, enough soldering paste 24 must be deposited upon trace elements 18 to bridge the gap 20 between the respective trace elements 18. In one embodiment of the invention, a volume of at least 8,300 mil cubed of solder paste 24 is required to bridge a gap of 0.0060 inches between elements 18.

After dispensing device 26 has deposited soldering paste 24 upon the appropriate trace elements 18, either the entire circuit board 10 or individual portions of the circuit board 10 are heated. As regions of circuit board 10 are heated, soldering paste 24 increases in temperature such that it changes in form from a paste to a liquid. When in liquid form, solder paste 24, is free to flow on trace elements 18. Because surface tension acting on solder 24 prevents the solder 24 from dripping off of trace elements 18 and onto circuit board 10, liquid solder 24 will collect on the edges of trace elements 18 such that it hangs over the gap 20 lying between trace elements 18. At the same time, the solder 24 on the corresponding trace element 18 in the same pattern hangs over the edge of that trace element 18 such that the solder 24 on one trace element 18 comes into contact with the solder 24 on the corresponding trace element 18.

While it is desirable for liquid solder 24 to flow over gaps 20 in individual patterns 14, it is especially undesirable for liquid solder 24 to flow from a trace element 18 on one circuit 14 onto a trace element 18 on a different circuit 14. To prevent this occurrence, circuit board 10 includes spaces 22 between circuits 14 (FIG. 5). The spaces 22 are large enough to prevent accidental flow of solder 24 from one of circuits 14 to another. In one embodiment of the invention, a space of at least 0.0040 inches exists between circuits 14.

Once the circuit board 10 has been sufficiently heated to allow liquid solder paste 24 on corresponding trace elements 18 in a particular circuit 14 to come into contact with one another, circuit board 10 is then cooled. As the temperature of circuit board 10 decreases, liquid solder 24 solidifies over gap 20, creating a connection between the trace elements 18 on bridge circuit 14 (FIG. 6).

Figure 7:
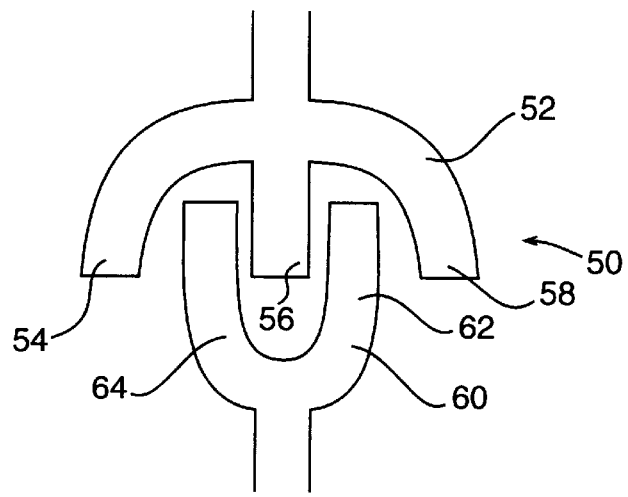
FIG. 7 is a top view of an alternate bridge circuit, wherein each pattern is curved and includes protrusions which complement the spaces between protrusions in the other trace element.

With reference to FIG. 7, an alternative bridge circuit 50 includes a first member 52 having a leg 54, a leg 56, and a leg 58. Legs 54 and 58 are curved, and leg 56 is straight. Leg 56 is disposed equidistant between legs 54 and 58. Bridge circuit 50 also includes a second element 60 including a curved leg 62 and a curved leg 64. Legs 62 and 64 are disposed equidistant about leg 56. Bridge circuit 50 operates similar to bridge circuits 14 discussed with reference to FIGS. 1–6.

Figure 8:
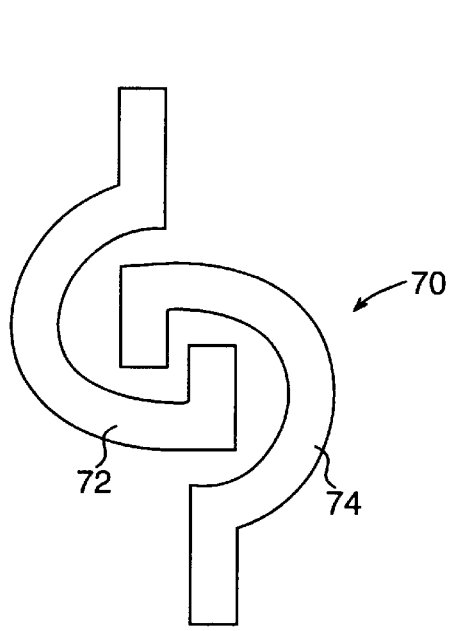
FIG. 8 is a top view of another alternate bridge circuit, wherein each trace element has a "hook" shape, and the end of the "hook" is located inside the open space of the other trace element.
Figure 9:
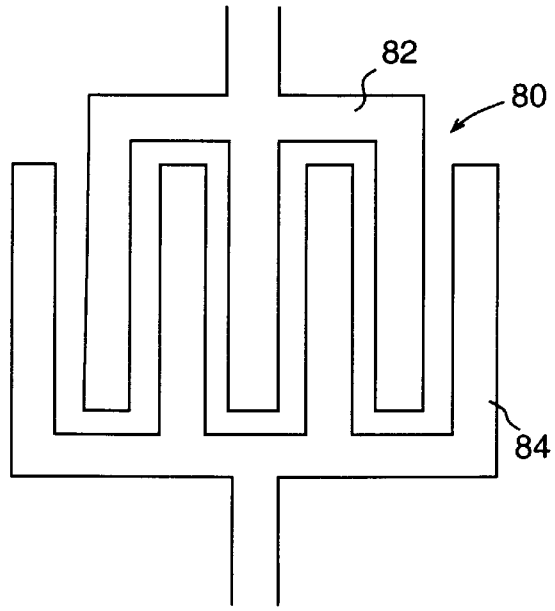
FIG. 9 is yet another bridge circuit, wherein each pattern includes protrusions which complement the spaces between protrusions in the other trace element.

With reference to FIG. 8, a bridge circuit 70 similar to bridge 50 is shown including a first curved member 72 and a second curved member 74. With reference to FIG. 9, a bridge circuit 80 similar to bridge circuits 50 and 70 is shown. Bridge circuit 80 includes a three-part member 82 and a four-part member 84.

With reference to FIG. 2, exemplary dimensions are given below for bridge circuits 14. Preferably, circuit 14 has a length 100 of nominally 0.040 inches and a width 102 of nominally 0.022 inches. The width of gap 20 is nominally 0.006 inches and a width 104 is nominally 0.008 inches.

Alternative gap sizes are given in table 1 below, including alternative volume sizes for paste 24 and spacing between circuits 14.

| Variable | Measurement |
|---|---|
| Gap | 1. 0.0060–"0.0076" |
|  | 2. 0.0070–"0.0090" |
|  | 3. 0.0080–"0.0098" |
| Spacing | 1. .036 |
|  | 2. .040 |
|  | 3. .044 |
| Volume | 1. 4,500 mil cubed–5,900 mil cubed |
|  | 2. 6,500 mil cubed–8,300 mil cubed |
|  | 3. 9,000 mil cubed–11,400 mil cubed |

Generally gap widths can be within a tolerance of +/−0.0012 inches for gaps widths of 0.006 inches. A volume of between 9,000 mil cubed to 12,000 mil cubed of paste 24 should be utilized to ensure low defect rates. A minimum spacing between bridge circuits 14 of approximately 0.0050 inches is recommended to reduce inadvertent shorting or paste robbing between adjacent patterns. Generally, circuit board 10 is for use in applications in which voltages do not exceed 10 VDC.

It is understood that, while the detailed drawings, specific examples and, particular component values given describe a preferred exemplary embodiment of the present invention, they are for the purpose of illustration only. The apparatus and method of the invention is not limited to the precise details and conditions disclosed. For example, although specific shapes for the bridge circuit, specific gap sizes, and specific volumes are discussed, they are for the purpose of illustration only. As advancements are made in electronic assembly techniques and materials, other gap sizes, volumes and bridge circuits can be utilized. Further, single lines in the drawings may represent multiple conductors. Various changes may be made to the details disclosed without departing from the spirit of the invention, which is defined by the following claims.

We claim:

1. A bridge structure on a circuit board, said bridge structure comprising:

a first conductive trace element being entirely on a top surface of the circuit board;

a second conductive trace L-shaped element being entirely on a top surface of the circuit board spaced near said first conductive trace element;

a gap lying between said first conductive trace element and said second L-shaped conductive trace element;

solder paste placed upon the first conductive trace element and the second L-shaped conductive trace element, said solder paste capable of flowing when said circuit board is heated such that the solder paste on said first conductive trace element comes into contact with the paste on the second L-shaped conductive trace element, wherein the first conductive trace element consists of an L-shape and consisting of a first member and a second member, the first conductive trace member being approximately perpendicular to the second member, wherein the second L-shaped conductive trace element consists of a third member and a fourth member, the third member being perpendicular to the fourth member, the first conductive trace element being inverted with respect to the second L-shaped conductive trace element, said paste solidifying when said circuit board is cooled such that the solidified paste serves to connect said first element and said L-shaped conductive trace second element to form an electrical connection between said first conductive trace element.

2. The bridge structure described in claim 1, wherein said first conductive trace element is a metal trace and formed in an "L" or backwards "L" shape.

3. The bridge structure of claim 1, wherein said first conductive trace element includes at least one approximate right angle.

4. The bridge structure of claim 1, wherein said first element and said second L-shaped conductive trace element include at least one approximate right angle.

5. The bridge structure of claim 1, wherein said solder paste is an alloy comprising tin and lead.

6. The bridge structure of claim 1, wherein said solder paste is a solder comprising Indium.

7. The bridge structure of claim 1, wherein at least 8,300 mil cubed of said solder paste is present on said first element and said second element before the circuit board is heated.

8. The bridge structure of claim 1, wherein said first conductive trace element has a width of no more than 0.0080 inches.

9. The bridge structure of claim 1, wherein said first conductive trace element and said second conductive trace element have a width of no more than 0.0080 inches.

10. The bridge structure described in claim 1, wherein said first conductive trace element and second L-shaped conductive trace element are metal traces formed in "L" or backwards "L" shapes.

11. The bridge structure described in claim 10, wherein the gap is an equal distance in directions parallel and perpendicular to the first member and the second member.

12. The bridge structure described in claim 10, wherein said gap is equal distance in directions parallel and perpendicular to the first member and the second member and the first member and the second member have a uniform width.

13. The bridge structure described in claim 10, wherein said gap is equal distance in directions parallel and perpendicular to the first member and the second member, wherein said first member, said second member, said third member and said fourth member have uniform widths.

14. The bridge structure described in claim 10, wherein said first conductive trace element and said second L-shaped conductive trace element are positioned such that the first member is parallel to the third member and the second member is parallel to the fourth member.

15. The bridge structure of claim 14, wherein the gap has a width no larger than 0.0090 m.

16. A bridge structure on a circuit board, said bridge structure comprising:

a first element entirely on a top surface of the circuit board;

a second element entirely on a top surface of the circuit board;

a gap between said first element and said second element; and means for connecting said first element and said second element via a reflow solder technique so electricity is capable of flowing across said bridge structure, wherein the first element consists of a first L-shape and consists of essentially a first member and second member, the first member being approximately perpendicular to the second member, wherein the second element consists of a second L-shape and consists essentially of a third member and a fourth member, the third member being perpendicular to the fourth member.

17. The bridge structure of claim 16, wherein each of the first and second elements has a first member parallel to a first axis and a second member parallel to a second axis.

18. The bridge structure of claim 17, wherein the first and second axes are perpendicular to each other.

19. A circuit board including a first element entirely on a top surface of the circuit board and a second element entirely on a top surface of the circuit board the first element and the second element being separated by a gap, the first element being coupled to the second element by a method comprising:

placing a solder paste on the first element and the second element, the first element consisting of a first L-shape and consisting of a first member and second member, the first member being perpendicular to the second member, the second element consisting of a second L-shape and consisting of a third member and a fourth member, the third member being perpendicular to the fourth member;

heating said circuit board such that said paste flows over said gap and connects said first element and said second element; and cooling said circuit board such that said paste solidifies.

20. The circuit board of claim 19, wherein said solder paste is a conductive epoxy, a tin/lead eutectic soldering paste, a tin/silver eutectic soldering paste, or a tin/lead/silver eutectic soldering paste, or an indium-containing soldering paste.

* * * * *